(12) United States Patent
Loeb et al.

(10) Patent No.: US 7,606,016 B1
(45) Date of Patent: Oct. 20, 2009

(54) POWER AMPLIFIER PROTECTION

(75) Inventors: Wayne A. Loeb, San Francisco, CA (US); Alireza Shirvani-Mahdavi, San Jose, CA (US)

(73) Assignee: Marvell International Ltd., Hamilton (BM)

(*) Notice: Subject to any disclaimer, the term of this patent is extended or adjusted under 35 U.S.C. 154(b) by 0 days.

(21) Appl. No.: 11/845,660

(22) Filed: Aug. 27, 2007

Related U.S. Application Data

(63) Continuation of application No. 10/767,045, filed on Jan. 28, 2004, now Pat. No. 7,268,990.

(60) Provisional application No. 60/470,629, filed on May 15, 2003.

(51) Int. Cl.
*H02H 3/20* (2006.01)
*H02H 9/04* (2006.01)

(52) U.S. Cl. .................. 361/111; 361/56; 361/91.1

(58) Field of Classification Search ............. 361/111, 361/56, 91.1
See application file for complete search history.

(56) References Cited

U.S. PATENT DOCUMENTS

| | | | |
|---|---|---|---|
| 4,019,150 A | 4/1977 | Lurey et al. | |
| 5,150,075 A | 9/1992 | Hietala et al. | |
| 5,543,760 A | 8/1996 | Honda et al. | |
| 5,608,595 A * | 3/1997 | Gourab et al. | 361/79 |
| 5,929,709 A | 7/1999 | Eriksson et al. | |
| 5,946,177 A * | 8/1999 | Miller et al. | 361/56 |
| 6,278,328 B1 | 8/2001 | Yamamoto et al. | |
| 6,388,525 B1 | 5/2002 | Bien | |
| 6,476,677 B1 | 11/2002 | Komaili et al. | |
| 6,525,611 B1 * | 2/2003 | Dening et al. | 330/298 |
| 6,563,385 B2 * | 5/2003 | Wojslaw | 330/296 |
| 6,580,321 B1 * | 6/2003 | Arell et al. | 330/207 P |
| 6,603,335 B1 | 8/2003 | Macphail et al. | |
| 6,720,831 B2 | 4/2004 | Dening et al. | |
| 6,762,647 B1 * | 7/2004 | Apel | 330/279 |
| 6,850,119 B2 * | 2/2005 | Arnott | 330/298 |
| 2003/0045251 A1 | 3/2003 | Arnott | |
| 2003/0076172 A1 | 4/2003 | Tichauer | |

OTHER PUBLICATIONS

IEEE Computer Society, "*Information Technology—Telecommunications and Information Exchange Between Systems—Local and Metropolitan Area Networks—Specific Requirements—Part 11: Wireless LAN Medium Access Control (MAC) and Physical Layer (PHY) Specifications*", IEEE Std 802.11—First Edition, 1999.

IEEE Computer Society, "*Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: High-speed Physical Layer in the 5 GHZ Band*", IEEE Std 802.11a—1999 (Supplement to IEEE Std 802.11—1999).

(Continued)

*Primary Examiner*—Stephen W Jackson
*Assistant Examiner*—Zeev Kitov

(57) ABSTRACT

A power amplifier protection circuit that includes protection circuitry to variably shunt an input radio frequency (RF) signal to AC ground, turn off bias to an output transistor of a power amplifier, and turn off the output transistor. The power amplifier protection circuit features an asymmetrical control that can quickly shut off a power amplifier, and turn on the power amplifier at a steady, controlled rate when an output transistor exceeds a predetermined threshold voltage.

29 Claims, 9 Drawing Sheets

OTHER PUBLICATIONS

IEEE Computer Society, "*Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Higher-speed Physical Layer Extension in the 2.4 GHZ Band*", IEEE Std 802.11b—1999 (Supplement to IEEE Std 802.11—1999).

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifictions: Amendment 7: Medium Access Control (MAC) Quality of Service (QoS) Enhancements*", IEEE P802.11e/D11.0, Oct. 2004.

IEEE Computer Society, "*IEEE Standard for Information Technology—DRAFT Supplement to STANDARD [for] Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Further Higher Data Rate Extension in the 2.4 GHz Band*", IEEE P802.11g/D8.2, Apr. 2003.

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 5: Spectrum and Transmit Power Management Extensions in the 5 GHz Band in Europe*", IEEE P802.11h—2003.

IEEE Computer Society, "*IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 6: Medium Access Control (MAC) Security Enhancements*", IEEE Std 802.11i—2004.

IEEE Computer Society, "*IEEE Project 802.14/a Draft 3 Revisions 3—Cable-TV Access Method and Physical Layer Specification*", IEEE 802.14 Draft3 R3—Oct. 25, 1998.

\* cited by examiner

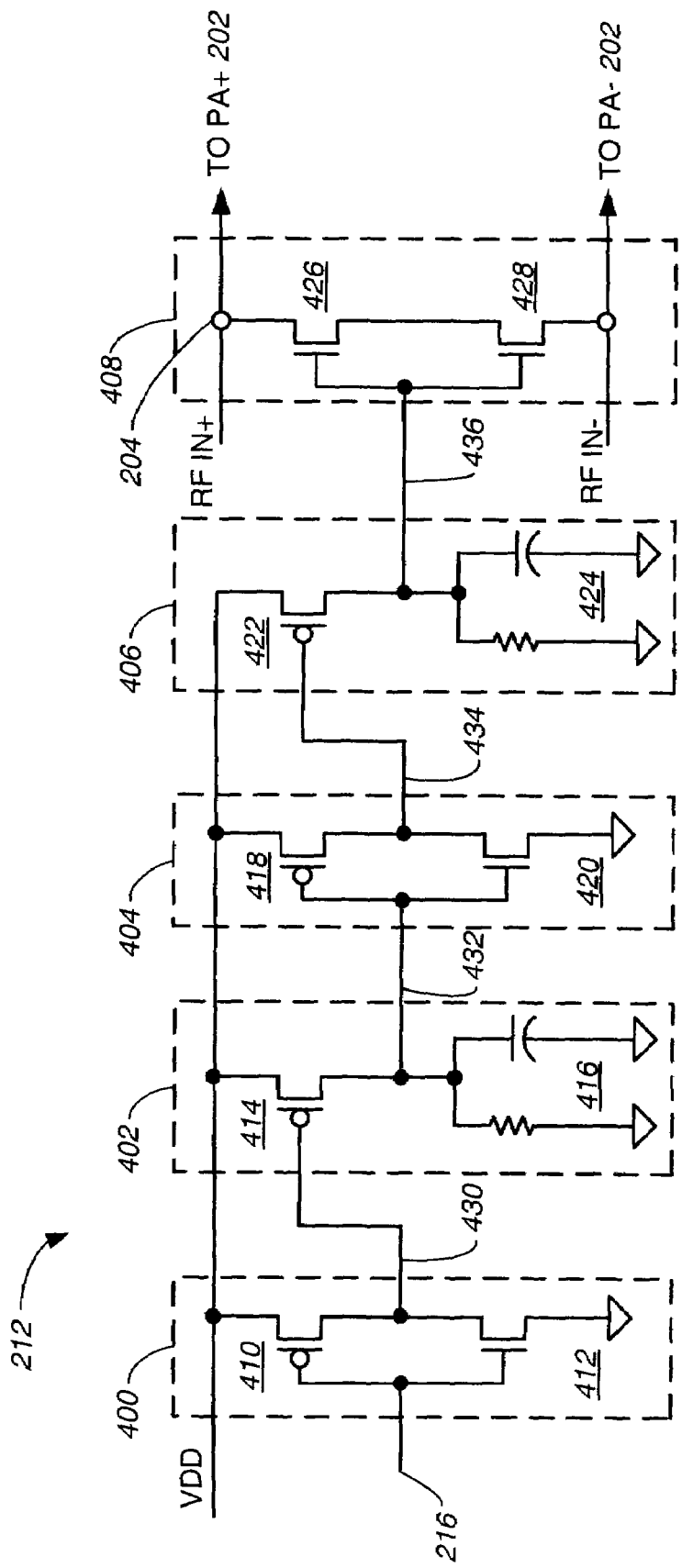
FIG._4

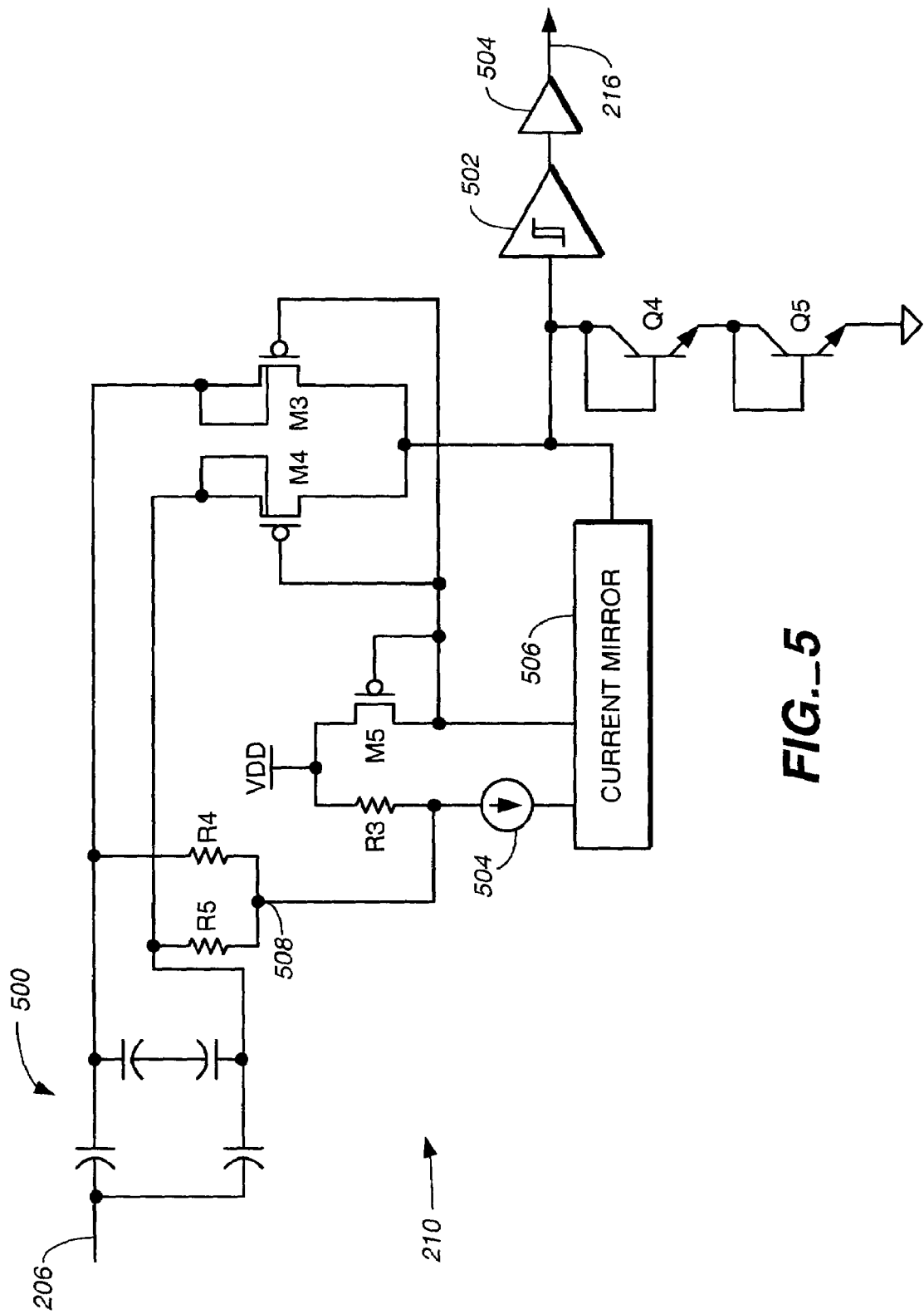
FIG._5

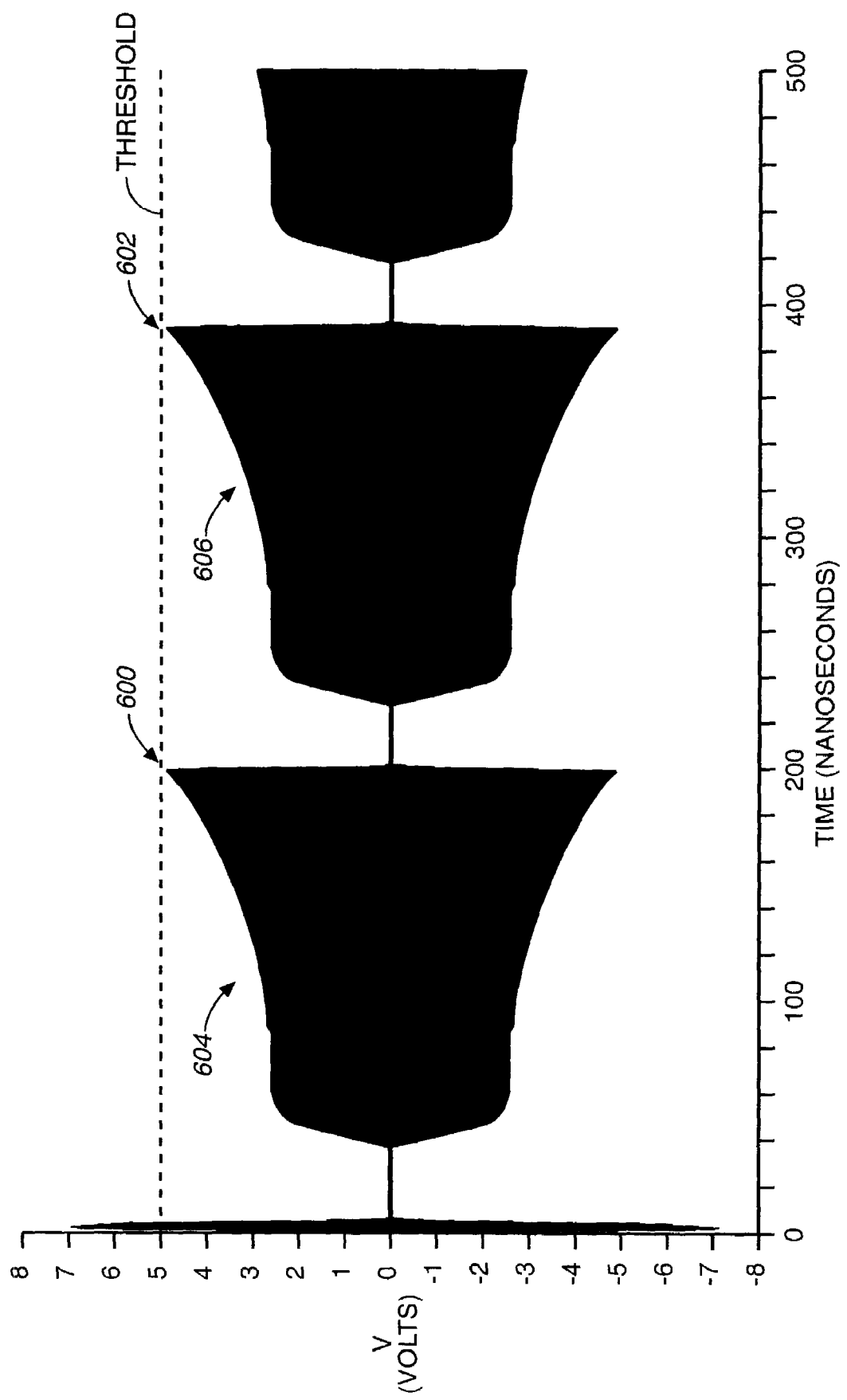
FIG._6

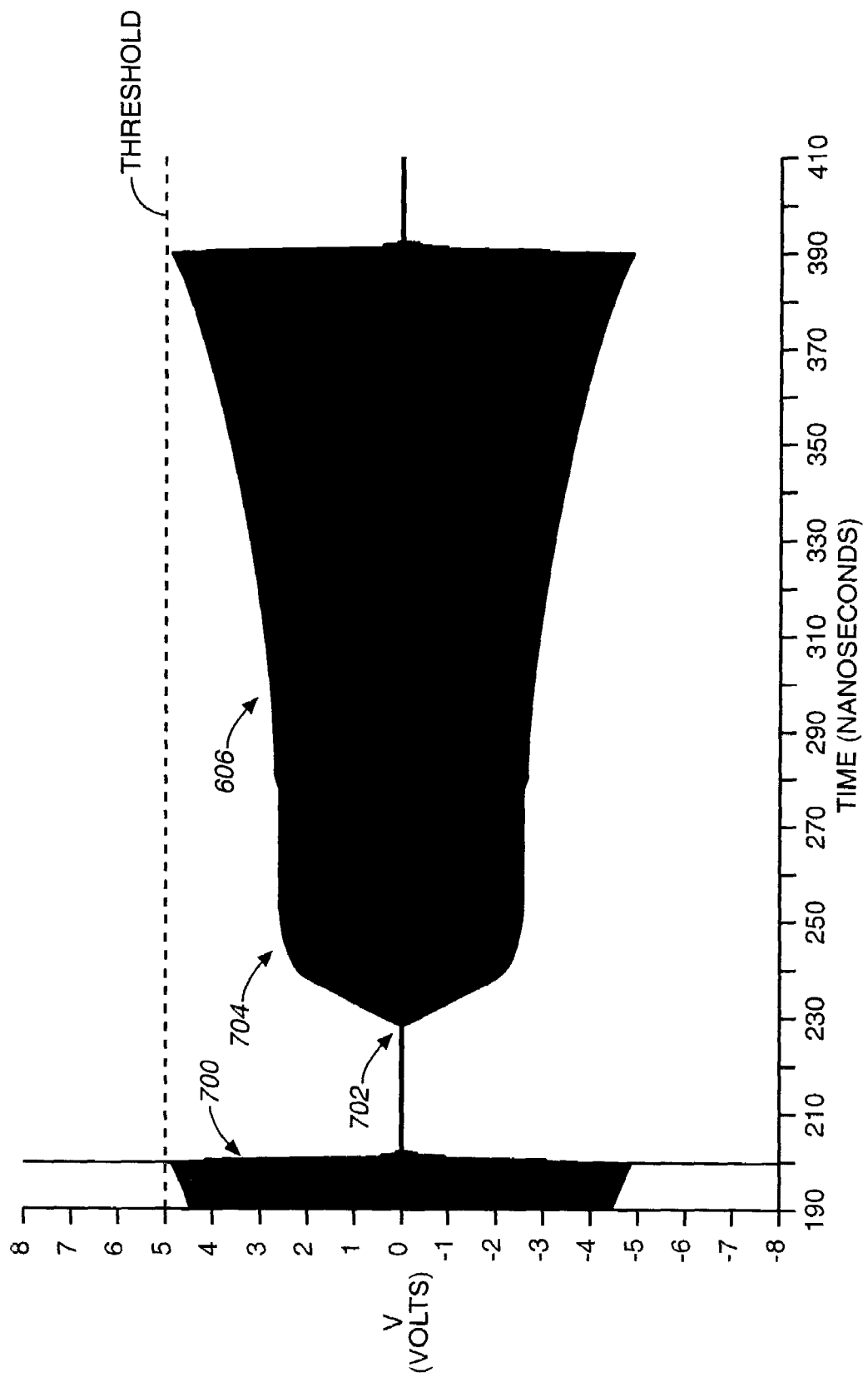
FIG._7

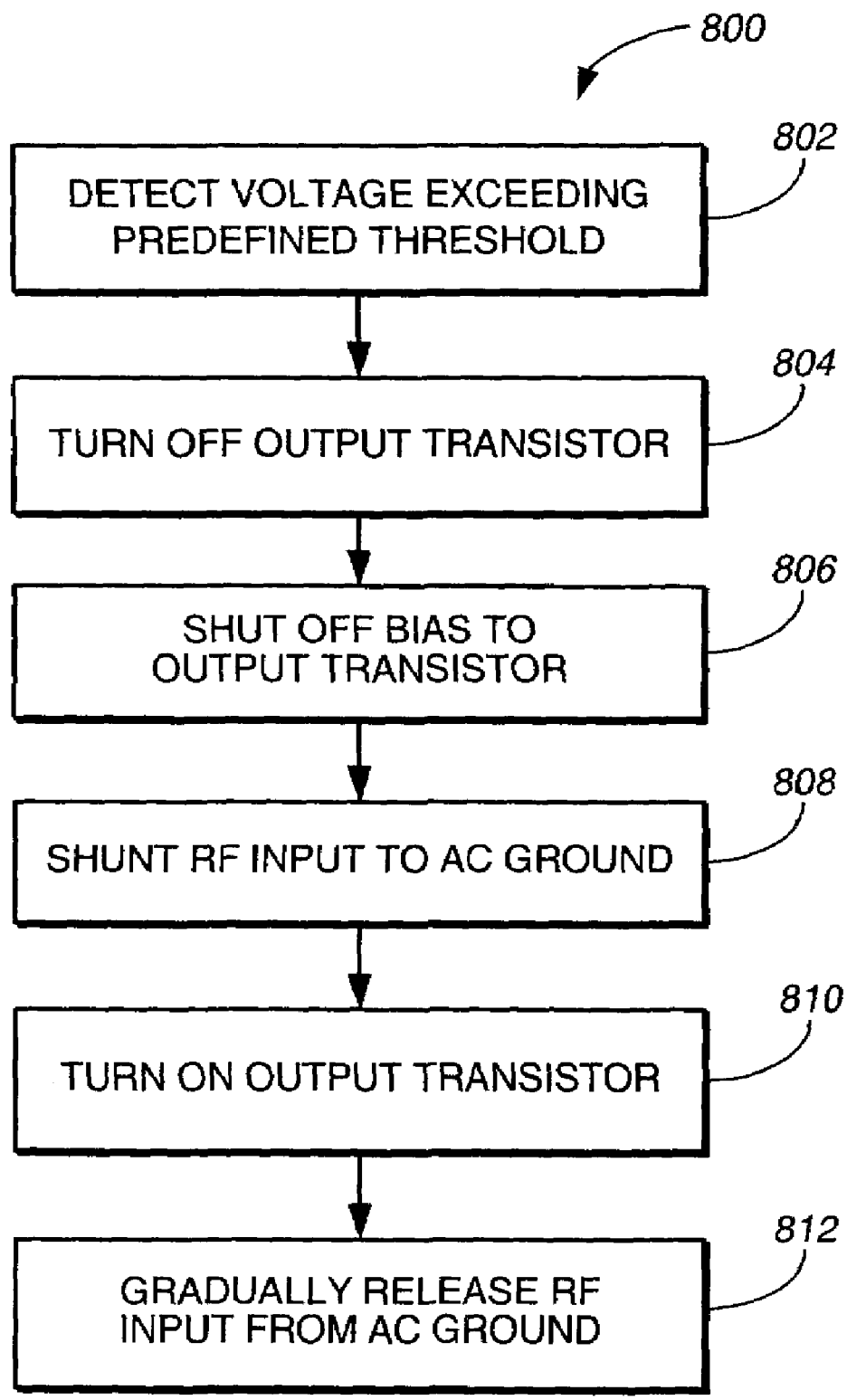
FIG._8

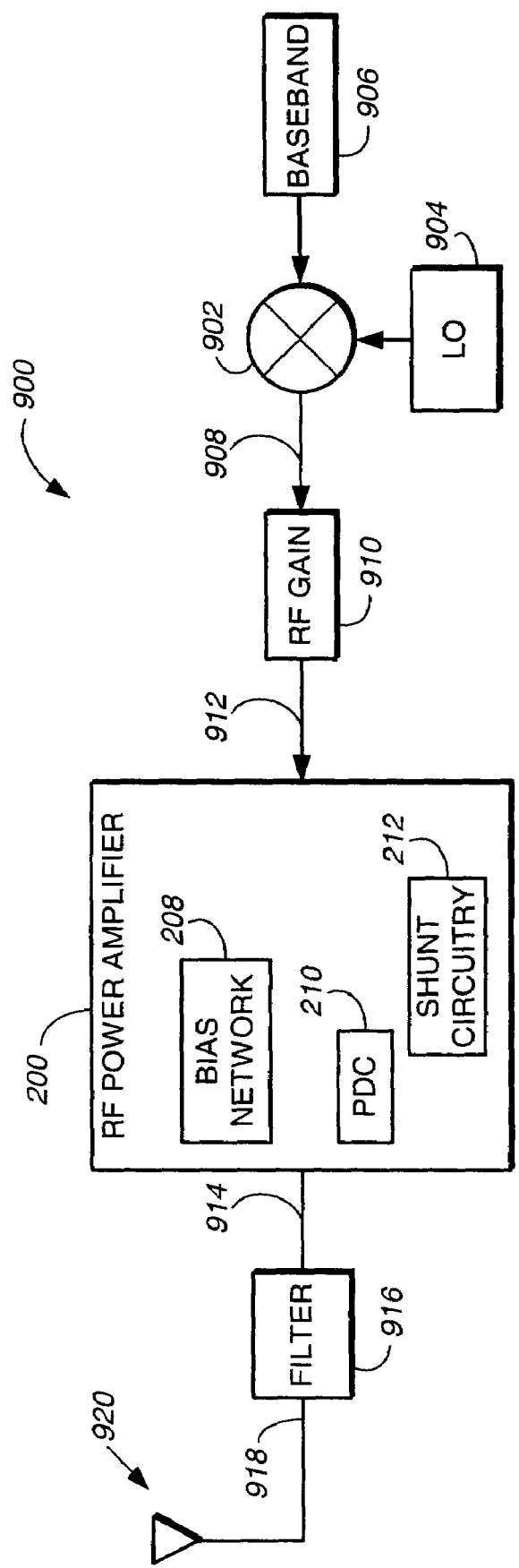
FIG._9

POWER AMPLIFIER PROTECTION

CROSS-REFERENCE TO RELATED APPLICATIONS

This application is a continuation application of U.S. patent application Ser. No. 10/767,045, filed on Jan. 28, 2004, which claims the benefit of U.S. Provisional Application No. 60/470,629, filed May 15, 2003. The entire disclosure of each of these prior applications is incorporated herein by reference.

BACKGROUND

This disclosure relates to electrical circuits.

Radio frequency (RF) power amplifiers for conventional wireless communication applications can be subjected to elevated voltages. Conventional RF power amplifiers are typically constructed using, e.g., gallium arsenide (GaAs) heterojunction bipolar transistors (HBTs) or silicon germanium (SiGe) bipolar transistors, which can break down under such elevated voltages. For example, a sub-micron (e.g., 0.35 μm) SiGe bipolar transistor has a base-collector breakdown voltage of approximately 5-8 volts. The elevated voltages can occur due to output load mismatch, and the like. Output load mismatch can occur, for example, when an antenna that is being driven by an RF power amplifier comes into contact with a foreign object or when a transmitter switch is open. Under mismatched conditions, the voltage at the collector of an output transistor can exceed the transistor's base-collector breakdown voltage.

FIG. 1 shows a graph of voltage vs. time for a collector of an output transistor of a wireless device. During the time shown a continuous mismatch condition was present (e.g., the antenna was in contact with a foreign object.) The device used was powered by a 3 volt supply, however, as shown in the graph the peak voltages at the collector often exceeds twice the power supply voltage.

A conventional peak detection circuit can be used to avoid excessive collector voltages. A conventional peak detection circuit pulls the base node of the output transistor to ground (i.e., turns the output transistor off) upon detection of a collector voltage peak 100 that is greater than, e.g., 5 volts. As the output transistor turns off, the collector voltage falls to zero. The output transistor turns back on at point 102 as the base node of the output transistor approaches the base-emitter threshold (e.g., 0.7 volts). Due to the continuous mismatch, a second collector voltage peak 104 occurs shortly thereafter, and the conventional peak detection circuit turns off the output transistor. This cycle repeats as long as the mismatch remains, as represented by subsequent collector voltage peaks 106, 108.

As shown in FIG. 1, each of collector voltage peaks 100, 104, 106, 108 contain multiple collector voltage swings above the 5 volt threshold of the conventional peak detection circuit. When the output transistor turns on (e.g., at point 102), the amplitude of the collector voltage rises, having an envelope slew rate greater than can be tracked by a conventional peak detection circuit—i.e., the conventional peak detection circuit cannot respond in time to prevent collector voltage swings above the 5 volt threshold. In the example of FIG. 1, the conventional peak detection circuit is unable to detect a collector voltage swing above the 5 volt threshold until approximately 4-5 nanoseconds after the collector voltage first exceeded the 5 volt threshold. The periodic, multiple collector voltage swings above the 5 volt threshold can lead to breakdown of the output transistor, and failure of the RF power amplifier.

SUMMARY

In general, in one aspect, this specification describes a protection circuit for a radio frequency (RF) power amplifier. The RF power amplifier is operable to receive an RF input signal and amplify the RF input signal. The RF power amplifier includes shunt circuitry operable to shunt an RF input signal to AC ground. The shunt circuitry includes a shunt switch operable to shunt the RF input signal to AC ground and release the RF input signal from AC ground, and control circuitry to control the shunt switch. The control circuitry includes ramp circuitry operable to control the shunt switch so that the shunt switch gradually releases the RF signal from AC ground for input to an RF amplifier.

Particular implementations can include one or more of the following features. The shunt switch can comprise a linear region MOSFET. The linear region MOSFET can be an NMOS transistor. The ramp circuitry can include an RC network. The shunt switch can gradually release the RF signal from AC ground exponentially. The ramp circuitry can release in accordance with a discharge of a capacitor in the RC network. The protection circuit can further include bias shutdown circuitry operable to shut off a bias voltage or a bias current being supplied to an output transistor of the RF amplifier. The protection circuit can further include peak detection circuitry operable to monitor an output voltage of the RF amplifier and provide a protection signal to the shunt circuitry and the bias shutdown circuitry when the output voltage of the RF amplifier exceeds a threshold voltage level. The threshold voltage level can be programmable through the peak detection circuitry. The control circuitry can further include delay circuitry operable to delay the ramp control circuitry from gradually releasing the RF input signal from AC ground. The delay circuitry can include an RC network.

In general, in another aspect, this specification describes an RF power amplifier. The RF power amplifier includes amplifier circuitry operable to amplify an RF input signal and provide an amplified RF output signal, and peak detection circuitry operable to monitor the amplified output RF signal and detect when the amplified output signal exceeds a threshold voltage level. The RF power amplifier further includes a bias network operable to provide a bias to the amplifier circuitry and shut off the bias to the amplifier circuitry when the peak detection circuitry detects that the amplified output signal has exceeded the threshold voltage level.

Particular implementations can include one or more of the following features. The bias network can be operable to further turn off an output transistor of the amplifier circuitry when the peak detection circuitry detects that the amplified output signal has exceeded the threshold voltage level. The RF power amplifier can further include shunt circuitry operable to shunt the RF input signal to AC ground when the peak detection circuitry detects that the amplified output signal has exceeded the threshold voltage level.

In general, in another aspect, this specification describes a method for protecting an RF power amplifier from elevated output voltages. The method includes detecting an output voltage of an RF power amplifier exceeding a threshold voltage level, shutting off bias to an output transistor of the RF power amplifier when the output voltage exceeds the threshold voltage level, and turning off the output transistor of the RF power amplifier when the output voltage exceeds the threshold voltage level.

Particular implementations can include one or more of the following features. The method can further include shunting an RF input signal to the RF power amplifier to AC ground when the output voltage exceeds the threshold voltage level. The method can also include supplying bias to the output transistor and turning on the output transistor when the output voltage is reduced to a level below the threshold voltage level. The method can also include gradually releasing the RF input signal from AC ground when the output voltage is reduced to a level below the threshold voltage level, and delaying the gradual release of the RF input signal from AC ground until a time after the output transistor has turned on. The method can also include providing an asymmetrical control that quickly shuts off the power amplifier and gradually turns on the power amplifier at a gradual rate.

In general, in another aspect, this specification describes a wireless transceiver. The wireless transceiver includes an RF power amplifier operable to amplify an RF input signal. The RF power amplifier includes amplifier circuitry operable to amplify the RF input signal and provide an amplified RF output signal, and includes peak detection circuitry operable to monitor the amplified output RF signal and detect when the amplified output signal exceeds a threshold voltage level. The RF power amplifier further includes a bias network operable to provide a bias to the amplifier circuitry and shut off the bias to the amplifier circuitry when the peak detection circuitry detects that the amplified output signal has exceeded the threshold voltage level.

Particular implementations can include one or more of the following features. The wireless transceiver can be compliant with the following IEEE standards—802.11, 802.11a, 802.11b, 802.11e, 802.11g, 802.11h, 802.11i, and 802.14.

In one implementation, a power amplifier protection circuit is provided that can detect an output transistor voltage swing above a threshold voltage within a few cycles to prevent a periodic breakdown of an associated power amplifier. The power amplifier protection circuit features an asymmetrical control that can quickly shut off the power amplifier, and turn on the power amplifier at a steady, controlled rate.

The details of one or more implementations are set forth in the accompanying drawings and the description below. Other features and advantages will be apparent from the description and drawings, and from the claims.

DESCRIPTION OF DRAWINGS

FIG. 4 schematic diagram of a RF input shunt circuit.

FIG. 5 is a schematic diagram of a peak detection circuit.

FIG. 6 is a graph illustrating collector voltages for the power amplifier circuitry of FIG. 2.

FIG. 7 is a graph illustrating the collector voltages of FIG. 6 in greater detail.

FIG. 8 is a process for protecting an RF power amplifier.

FIG. 9 is a block diagram of a transmit path of a wireless transceiver.

Like reference symbols in the various drawings indicate like elements.

DETAILED DESCRIPTION

Figure 1:
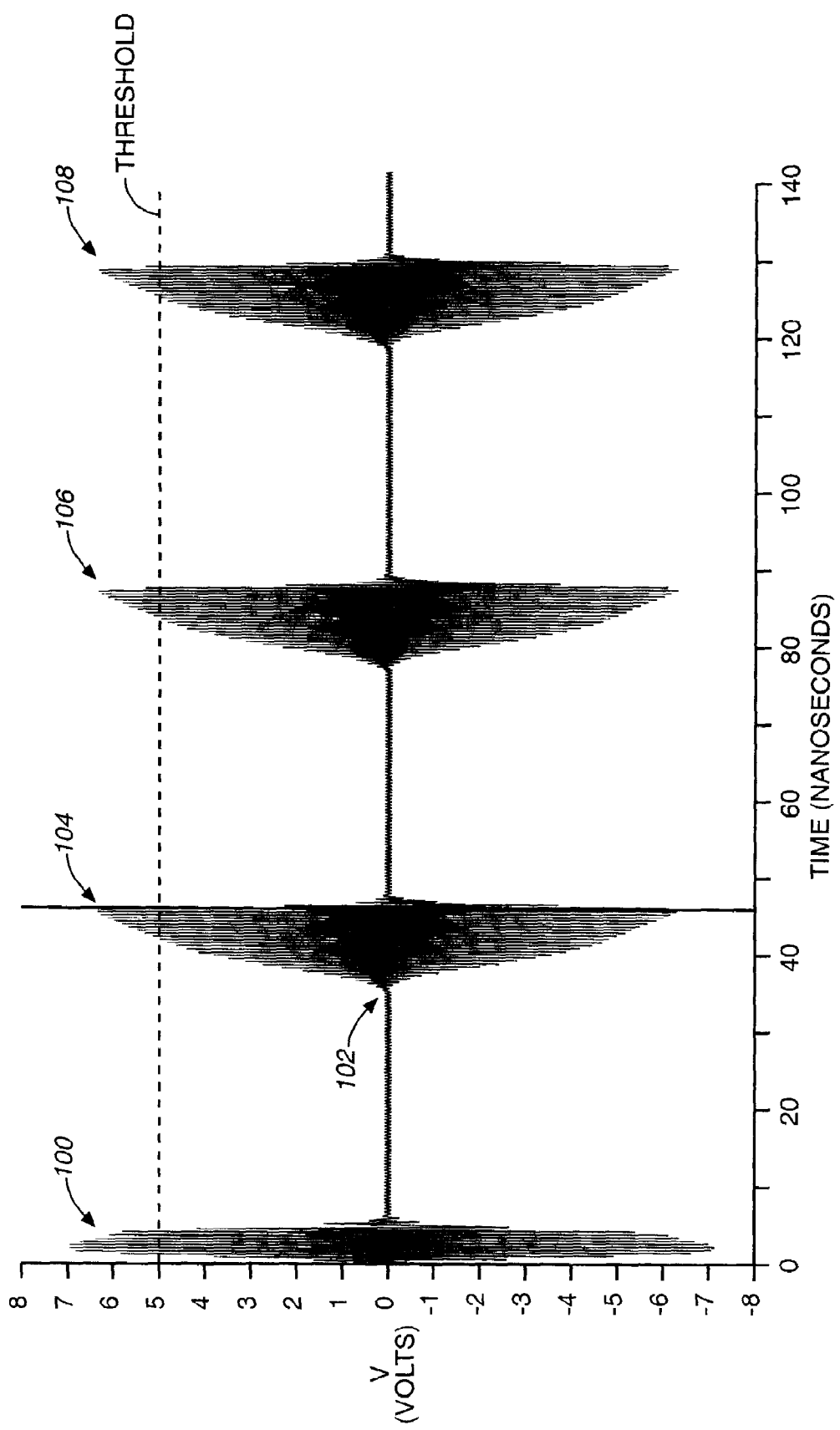
FIG. 1 is a graph illustrating peak collector voltages for an output transistor of a power amplifier when a peak detector is used to protect against excessive collector voltages.
Figure 2:
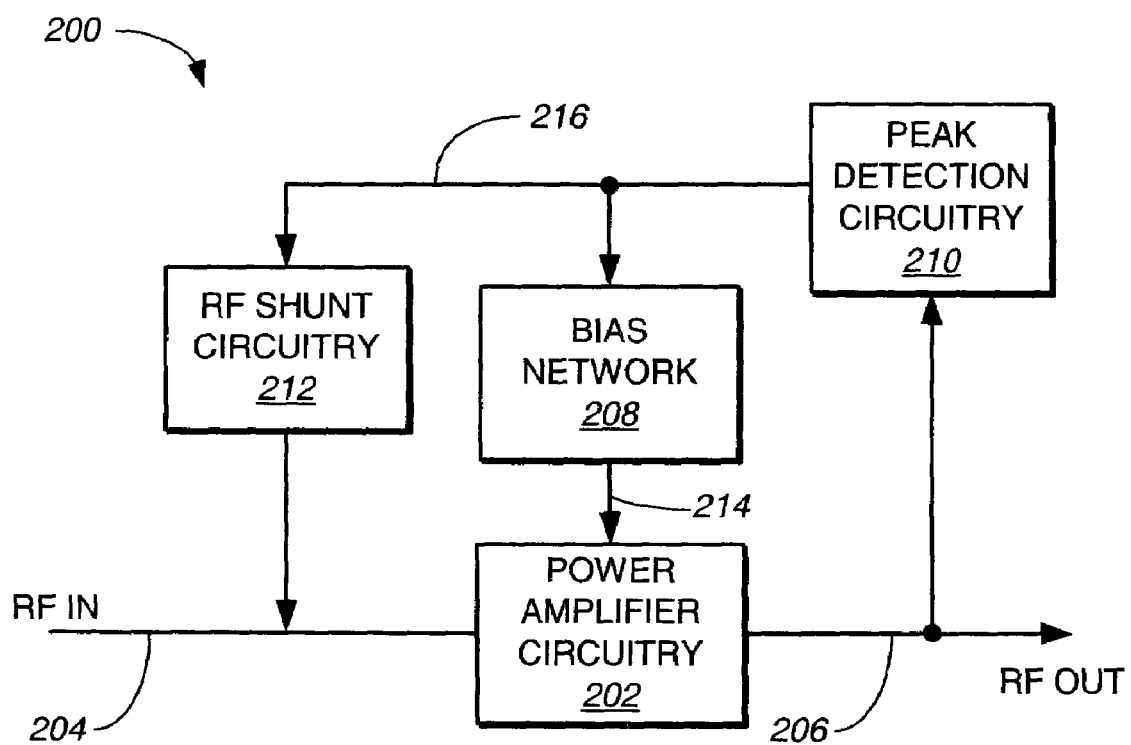
FIG. 2 is a block diagram of an RF power amplifier including power amplifier circuitry, peak detection circuitry, a bias network, and RF input shunt circuitry.

FIG. 2 illustrates an RF power amplifier 200. RF power amplifier 200 includes power amplifier circuitry 202 for amplifying an RF input signal (RF IN) 204 to provide an amplified RF output signal (RF OUT) 206. Power amplifier circuitry 202 can be implemented using transistors, for example, GaAs HBTs or SiGe bipolar transistors. Power amplifier circuitry 202 can also be implemented using CMOS transistor technologies and other transistor technologies, including silicon and gallium nitrite.

RF power amplifier 200 further includes a bias network 208, peak detection circuitry 210, and RF input shunt circuitry 212. RF input shunt circuitry 212 provides envelope slew rate control (of the amplitude of RF OUT 206) during continuous mismatch, as discussed in greater detail below. Bias network 208 provides bias voltage and/or bias current 214 to power amplifier circuitry 202. Bias network 208 can be fixed or controlled to provide optimized amplifier operation and gain under normal conditions. Peak detection circuitry 210 monitors voltages of RF OUT 206. When a voltage level of RF OUT 206 exceeds a predefined threshold, peak detection circuitry 210 provides a protection signal 216 to bias network 208 and RF input shunt circuitry 212. The predefined threshold can be programmable, as discussed in greater detail below.

Bias network 208 responds to protection signal 216 by shutting off the bias voltage and/or bias current being supplied to power amplifier circuitry 202, and effectively turning off power amplifier circuitry 202. RF input shunt circuitry 212 responds to protection signal 216 by differentially shunting RF IN 204 (or reducing the gain of amplifier 200). RF IN 204 can be differentially shunted by shunting RF IN 204 to AC ground. When a voltage level of RF OUT 206 drops below the predefined threshold, protection signal 216 provided by peak detection circuitry 210 to bias network 208 and RF input shunt circuitry 212 is released.

A predefined time period after protection signal 216 is released, power amplifier circuitry 202 turns on and outputs RF OUT 206. To protect in a case of continuous mismatch, RF input shunt circuitry 212 contains a delay stage so that RF input shunt circuitry 212 continues to shunt RF IN 204 to AC ground until after power amplifier circuitry 202 has turned back on. Thereafter, RF input shunt circuitry 212 gradually releases RF IN 204 from AC ground at a controlled rate so that the amplitude of RF OUT 206 rises with an envelope slew rate that can be tracked by peak detection circuitry 210.

Figure 3:
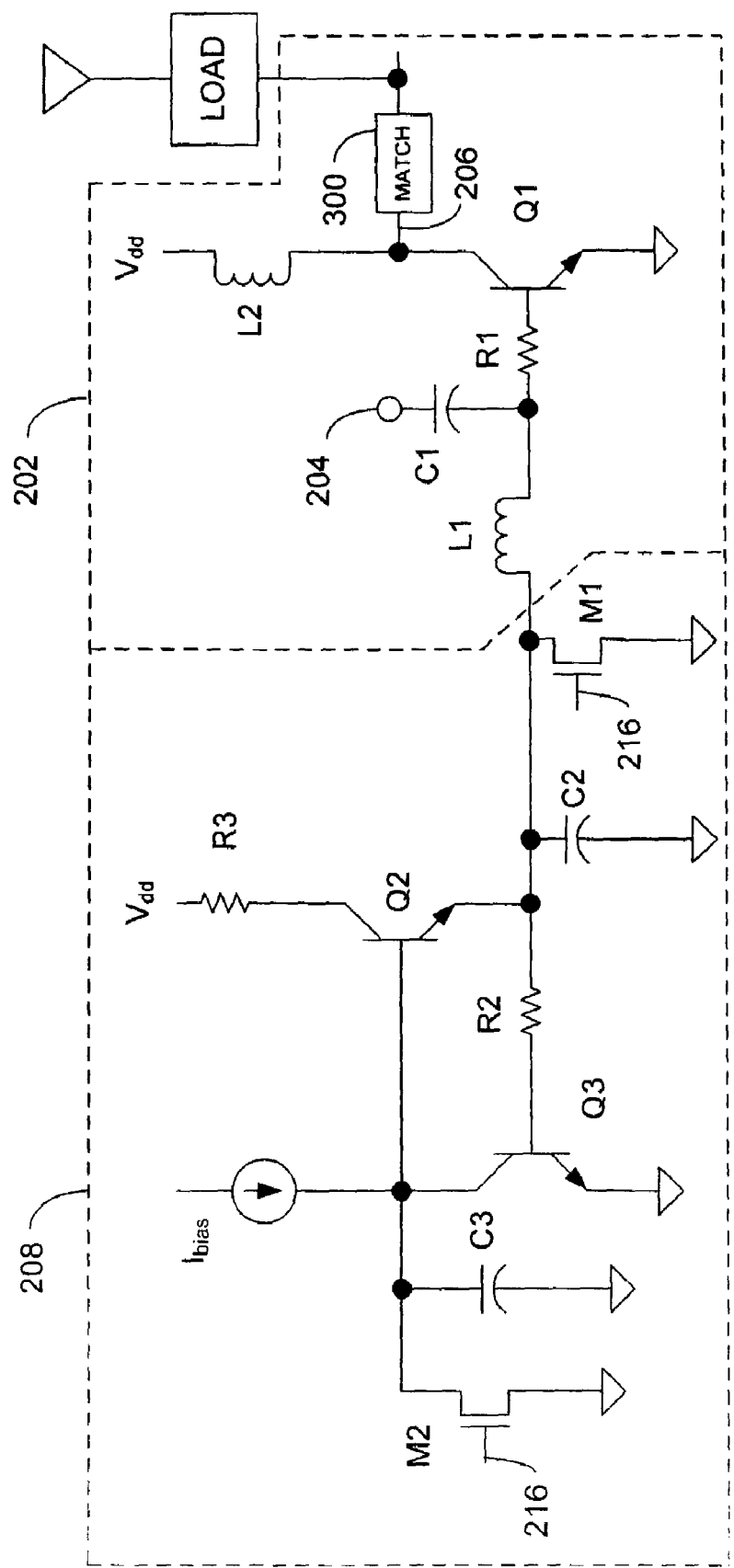
FIG. 3 is schematic diagram of a power amplifier circuit and a biasing network circuit.

FIG. 3 illustrates one implementation of power amplifier circuitry 202 and bias network 208. RF IN 204 is amplified by power amplifier circuitry 202 to produce RF OUT 206. Power amplifier circuitry 202 generally includes a network of resistors, capacitors, and transistors represented by capacitor C1, resistor R1, inductors L1, L2, and transistor Q1 (i.e., the output transistor). Power amplifier circuitry 202 also includes a matching network 300 to match an antenna load (e.g., 50 ohms) to a convenient impedance. As illustrated in FIG. 3, RF IN 204 is delivered and controls transistor Q1. A DC bias is provided by bias network 208 through inductor L1.

Bias network 208 is configured to provide an optimal DC bias to transistor Q1 through inductor L1 under normal operating conditions. Bias network 208 includes transistors Q2, Q3, a power voltage supply (VDD), a current supply Ibias, resistor R2, and capacitors C2, C3. Transistor Q2 supplies a bias (base) current to transistor Q1 through inductor L1. Resistors R1 and R2 are ballast resistors that ensure equal current distribution to transistor Q1.

Bias network 208 further includes transistors M1 and M2 to turn off transistors Q1 and Q2 to shut off their respective bias (base) current being supplied in response to receiving protection signal 216. Transistor M1, in the presence of protection signal 216, couples the base node of Q1 to ground. Transistor M2, in the presence of protection signal 216, couples the base node of Q2 to ground. When RF OUT 206 drops below the predefined threshold, the base nodes of transistors Q1 and Q2 are released (i.e., transistors M1 and M2 are turned off. Transistors Q1 and Q2 turn back on after capacitors C2 and C3 have charged to the threshold voltage of transistors Q1 and Q2, respectively.

FIG. 4 illustrates one implementation of RF input shunt circuitry 212. RF input shunt circuitry 212 operates under control of peak detection circuitry 210. In a case of continuous mismatch, RF input shunt circuitry 212 shunts RF IN 204 to AC ground for a predefined time period (e.g., until transistor Q1 turns on). Thereafter, RF input shunt circuitry 212 gradually releases RF IN 204 from AC ground at a controlled rate so that RF OUT 206 has an envelope slew rate that can be tracked by peak detection circuitry 210.

In one implementation, RF input shunt circuitry 212 includes an inverter stage 400, a delay stage 402, a buffer stage 404, a ramp control stage 406, and a shunt switch 408. Delay stage 402 provides a first delay for a predefined time period (e.g., a delay time long enough for transistor Q1 to turn on). Ramp control stage 406 provides a variable input voltage to shunt switch 408, and in response shunt switch 408 gradually releases RF IN 204 from AC ground, as discussed in greater detail below.

In one implementation, inverter stage 400 includes a pull-up PMOS transistor 410 and a pull-down NMOS transistor 412. In one implementation, delay stage 402 includes a pull-up PMOS transistor 414 and a pull-down RC network 416. In one implementation, buffer stage 404 includes a pull-up PMOS transistor 418 and a pull-down NMOS transistor 420. In one implementation, ramp control stage 406 includes a pull-up PMOS transistor 422 and a pull-down RC network 424. In one implementation, shunt switch 408 is formed by two linear region NMOS transistors 426 and 428. Shunt switch 408 can also be formed of PMOS transistors or an NMOS/PMOS transmission gate.

When protection signal 216 is asserted, inverter stage 400 outputs a low voltage signal 430 to delay stage 402. PMOS transistor 414 turns on, and delay stage 402 outputs a high voltage signal 432 to buffer stage 404. NMOS transistor 420 turns on, and buffer stage 404 outputs a low voltage signal 434 to ramp control stage 406. PMOS transistor 422 turns on, and ramp control stage 406 outputs a high voltage signal 436 to shunt switch 408. NMOS transistors 426 and 428 of shunt switch 408 turn on and shunt RF IN 204 to AC ground (i.e., the differential signals of RF IN 204 are tied together)

When peak detection circuitry 210 releases protection signal 216, PMOS transistor 410 turns on and inverter stage 400 outputs a high voltage signal 430 to buffer stage 404. PMOS transistor 414 turns off and pull-down RC network 424 pulls the output (signal 432) of delay stage 402 to ground after a predefined time (e.g., after capacitors C2 and C3 have charged to the threshold voltage of transistors Q1 and Q2, respectively). PMOS transistor 418 turns on when RC network 424 pulls the output of delay stage 402 to ground, and buffer stage 404 outputs a high voltage signal 434 to ramp control stage 406. PMOS transistor 422 turns off, and the output of ramp control stage 406 (signal 436) exponentially falls to zero (according to an RC time constant of RC network 424). As the output of ramp control stage 406 exponentially falls to zero, shunt switch 408 gradually releases RF IN 204 from AC ground.

FIG. 5 shows an implementation of peak detection circuitry 210. Peak detection circuitry 210 detects collector voltages exceeding a predefined threshold. Peak detection circuitry 210 includes transistors M3 through M5, resistors R3 through R5, a capacitive divider 500, bipolar transistors Q4, Q5, a Schmidt trigger 502, and a buffer 504.

RF OUT 206 (or the collector voltage of output transistor Q1) is AC coupled and divided down. For example, RF OUT 206 can be divided down with 1:5 ratio using capacitive divider 500. Peak detection circuitry 210 can sense a signal (e.g., RF OUT 206) that is larger than a supply voltage associated with peak detection circuitry 210. The divided down signal is then passed to sources of transistors M3 and M4. Transistors M3 and M4 are PMOS transistors, each having an n-well tied to a respective source. An identical transistor M5 biases the gates of transistors M3 and M4. An NMOS current mirror 506 forces an equal current (e.g., 6 µA) through the M3-M4 branch and M5 branch; however, transistors M3 and M4 only conduct when a gate-source voltage (Vgs) of transistors M3 and M4 is larger than a Vgs of transistor M5.

The sources of transistors M3 and M4 are biased using a DC level shift from the supply. In one implementation, the DC level shift value is programmable, and controlled by a 3-bit programmable current source 504. Programmable current source 504 passed a programmable current through resistor R3 to generate a variable DC voltage drop at node 508. The variable DC voltage drop is used to bias the source of transistors M3 and M4 through resistors R4 and R5, respectively.

If the divided down swing of RF OUT 206 (i.e., the collector voltage) is larger than the DC voltage drop across the bias resistor (i.e., resistors R3 or R4), then the Vgs of transistor M3 or M4 will be greater than the Vgs of transistor M5, and transistor M3 or M4 conduct current. This results is a nominally zero voltage on the drain of transistors M3 and M4 to rise. The rise of the drain voltage of transistors M3 and M4 are detected by Schmidt trigger 502. The output of Schmidt trigger 502 can be buffered through buffer 504 and sent as protection signal 216 to bias network 208 and RF input shunt circuitry 212.

The separate n-wells of transistors M3 and M4 are tied to their respective sources to avoid turning on the source-bulk junction diode when the source swings above VDD. This however, may cause a problem when a voltage on the drains of transistors M3 and M4 rise, as the common source and substrate node on either transistor M3 or M4 can swing below the drain voltage due to a large collector output voltage. This conflict can be resolved by limiting the voltage on the drain of transistors M3 and M4 using two series diode-connected bipolar transistors Q4, Q5. Bipolar transistors Q4, Q5 limit the drain voltage of transistors M3 and M4 to, for example, 1.6 volts, and prevent the drain-bulk diode from turning on.

FIG. 6 illustrates a controlled collector output voltage in a case of continuous mismatch, for an output transistor of an output device. In the example of FIG. 6, the power supply voltage is 3 volts. Collector output peaks 600 and 602 do not contain multiple collector voltage swings above the 5 volt threshold. The amplitude of the collector voltage, represented by envelopes 604, 606, rises with a slew rate that can be tracked by a peak detection circuit, for example, peak detection circuitry 210.

FIG. 7 illustrates envelope 606 in greater detail. Referring now to FIGS. 3, 4, and 7, at point 700, the base node of transistor Q1 is pulled to ground and bias being supplied to transistor Q1 is shut off. In addition, shunt circuit 408 shunts RF IN 204 to AC ground. At point 702, transistor Q1 turns back on, and in the case of continuous mismatch, the amplitude of the collector voltage for the output transistor begins to rise sharply. However, the amplitude of the collector voltage does not approach the 5 volt threshold because shunt switch 408 continues to shunt RF IN 204 to AC ground. At point 704, RC network 424 pulls the output of RC delay stage 402 to ground. Thereafter, shunt switch slowly releases RF IN 204 from AC ground at a controlled rate, and as a result envelop 606 rises having a slew rate that can be tracked by a peak detection circuit. In the example of FIG. 7, a peak detection circuit can respond to a collector voltage that exceeds a predefined threshold voltage within 1 nanosecond.

FIG. 8 shows a process 800 for protecting an RF power amplifier. A collector voltage exceeding a predefined threshold is detected (step 802). The output transistor is turned off (step 804). Bias (voltage and/or current) being supplied to the output transistor is shut off (step 806). An RF input signal to the RF power amplifier is shunted to AC ground (step 808). After steps 804-808 occur, the collector voltage is reduced to a level below the predefined threshold. Once the collector voltage is reduced, bias is supplied to the output transistor, and the output transistor turns on (step 810). The RF input signal is gradually released from AC ground at a controlled rate (step 812). In one implementation, the RF input signal is released from AC ground after the output transistor turns on. By shunting the RF input signal to AC ground until after the output transistor turns on, the amplitude of the collector voltage does not rapidly exceed the threshold voltage (e.g., in a case of continuous mismatch), as the gain of the RF power amplifier is reduced. As the RF input signal is gradually released from AC ground, the amplitude of the collector voltage rises having a slew rate that can be tracked by a peak detection circuit.

RF power amplifier 200 (FIG. 2) can be employed in a wide range of applications, for example, in a wireless transceiver 900 for communicating information, as shown in FIG. 9. The transmit path of wireless transceiver 900 includes RF power amplifier 200 for amplifying a power level of a frequency modulated signal. RF power amplifier 200 includes bias network 208, peak detection circuitry 210, and RF input shunt circuitry 212. A mixer 902 combines an RF LO (local oscillator) signal 904 with a baseband signal 906 to produce a modulated RF signal 908. An RF gain amplifier 910 amplifies modulated RF signal 908 to produce an amplified RF signal 912. Power amplifier 200 further amplifies a power level of RF signal 912 to produce an amplified signal 914. A filter 916 removes distortions caused by amplification of RF signal 912 and produces a transmission signal 918 having a suitable frequency band for transmission. Transmission signal 918 is transmitted through antenna 920. Wireless transceiver 900 can be IEEE 802 compliant with the following standards 802.11, 802.11a, 802.11b, 802.11e, 802.11g, 802.11h, 802.11i, and 802.14.

A number of implementations have been described. Nevertheless, it will be understood that various modifications may be made without departing from the spirit and scope of the invention. For example, RF input 204 can be a single-ended signal as well as a differential signal. Accordingly, other implementations are within the scope of the following claims.

What is claimed is:

1. A protection circuit comprising:
   shunt circuitry operable to shunt an RF input signal toward ground, the shunt circuitry including,
   a shunt switch operable to shunt the RF input signal to ground and release the RF input signal from ground, the shunt switch being controlled by control circuitry; and
   the control circuitry including ramp circuitry, the ramp circuitry operable to control the shunt switch so that the shunt switch releases the RF signal from ground, the control circuitry including a delay stage so that the shunt circuitry continues to shunt the RF input signal to ground until after an associated circuit has turned back on after a shutdown event; and
   bias shutdown circuitry operable to shut off a bias voltage or a bias current being supplied to an output transistor of the associated circuit.

2. The protection circuit of claim 1, wherein the shunt switch comprises a MOSFET transistor operating in a linear region.

3. The protection circuit of claim 2, wherein the MOSFET transistor is an NMOS transistor.

4. The protection circuit of claim 1, wherein the ramp circuitry includes an RC network.

5. The protection circuit of claim 4, wherein the shunt switch gradually releases the RF signal from AC ground exponentially.

6. The protection circuit of claim 4, wherein the ramp circuitry releases in accordance with a discharge of a capacitor in the RC network.

7. The protection circuit of claim 1, further comprising peak detection circuitry operable to monitor an output voltage of the associated circuit and provide a protection signal to the shunt circuitry and the bias shutdown circuitry when the output voltage of the associated circuit exceeds a threshold voltage level.

8. The protection circuit of claim 7, wherein the threshold voltage level is programmable through the peak detection circuitry.

9. The protection circuit of claim 1, wherein the delay circuitry is operable to delay the ramp control circuitry from gradually releasing the RF input signal from AC ground.

10. The protection circuit of claim 9, wherein the delay circuitry includes an RC network.

11. A protection circuit comprising:
    shunting means for shunting an RF input signal to ground and releasing the RF input signal from ground, the shunting means being controlled by control means; and
    the control means for controlling the shunting means so that the shunting means releases the RF signal from ground for input to an associated circuit, the control means including a delaying means for delaying a release of the RF input signal until after the associated circuit has turned back on after a shutdown event; and
    biasing means for shutting off a bias voltage or a bias current being supplied to an output transistor of the associated circuit.

12. The protection circuit of claim 11, wherein the shunting means comprises a MOSFET transistor operating in a linear region.

13. The protection circuit of claim 12, wherein the MOSFET transistor is an NMOS transistor.

14. The protection circuit of claim 11, wherein the control means includes an RC network.

15. The protection circuit of claim 14, wherein the shunting means gradually releases the RF signal from AC ground exponentially.

16. The protection circuit of claim 14, wherein the control means controls the shunting means to release the RF signal from ground in accordance with a discharge of a capacitor in the RC network.

17. The protection circuit of claim 12, further comprising detecting means for monitoring an output voltage of the associated circuit and providing a protection signal to the shunting means and the biasing means when the output voltage exceeds a threshold voltage level.

18. The protection circuit of claim 1, wherein the threshold voltage level is programmable through the detecting means.

19. The protection circuit of claim 18, wherein the delay means is operable to delay the shunting means from gradually releasing the RF input signal from AC ground.

20. The protection circuit of claim 19, wherein the delay means includes an RC network.

21. A method for protecting a circuit from elevated output voltages, the method comprising:
  defining a threshold voltage level for a peak detection;
  detecting an output voltage of a circuit exceeding the threshold voltage level;
  reducing a bias to the circuit when the output voltage exceeds the threshold voltage level; and
  separately from reducing the bias circuit, shunting to ground an input of the circuit when the output voltage exceeds the threshold voltage level, until after an output transistor has turned back on.

22. The method of claim 21, further comprising:
  shunting an RF input signal to an RF power amplifier in the circuit to ground when the output voltage exceeds the threshold voltage level.

23. The method of claim 22, further comprising:
  supplying bias to the output transistor of the circuit and turning on the output transistor when the output voltage is reduced to a level below the threshold voltage level.

24. The method of claim 23, further comprising:
  gradually releasing the RF input signal from ground when the output voltage is reduced to a level below the threshold voltage level.

25. The method of claim 24, further comprising:
  delaying the release of the RF input signal from ground until a time after the output transistor has turned on.

26. The method of claim 22, further comprising providing an asymmetrical control that quickly shuts off the power amplifier and turns on the power amplifier at a predetermined rate.

27. The method of claim 21 wherein reducing the bias comprises reducing the bias by a fixed amount.

28. The method of claim 21 wherein reducing the bias comprises reducing the bias by a programmable amount.

29. The method of claim 21 wherein shunting to ground an input of the circuit comprises shutting off the output.

* * * * *